United States Patent
Kazama (10) Patent No.: US 7,091,734 B2
(45) Date of Patent: Aug. 15, 2006

(54) ELECTROCONDUCTIVE CONTACT UNIT

(75) Inventor: Toshio Kazama, Nagano (JP)

(73) Assignee: NHK Spring Co., Ltd., Kanagawa (JP)

( * ) Notice: Subject to any disclaimer, the term of this patent is extended or adjusted under 35 U.S.C. 154(b) by 0 days.

(21) Appl. No.: 10/482,303

(22) PCT Filed: Jul. 1, 2002

(86) PCT No.: PCT/JP02/06648

§ 371 (c)(1),
(2), (4) Date: Jul. 21, 2004

(87) PCT Pub. No.: WO03/005043

PCT Pub. Date: Jan. 16, 2003

(65) Prior Publication Data

US 2004/0239356 A1 Dec. 2, 2004

(30) Foreign Application Priority Data

Jul. 2, 2001 (JP) ............................. 2001-201176

(51) Int. Cl.
*G01R 1/73* (2006.01)
(52) U.S. Cl. ...................... 324/761; 324/754
(58) Field of Classification Search ................ 324/762
See application file for complete search history.

(56) References Cited

U.S. PATENT DOCUMENTS

| | | | | |
|---|---|---|---|---|
| 4,029,375 A | * | 6/1977 | Gabrielian | ................... 439/66 |
| 5,521,519 A | | 5/1996 | Faure et al. | |
| 5,532,657 A | * | 7/1996 | Stoehr et al. | ................ 333/243 |
| 5,727,954 A | * | 3/1998 | Kato et al. | ..................... 439/66 |
| 6,246,245 B1 | | 6/2001 | Akram et al. | |
| 6,573,738 B1 | * | 6/2003 | Matsuo et al. | .............. 324/754 |

FOREIGN PATENT DOCUMENTS

| | | |
|---|---|---|
| EP | 685742 | 6/1994 |
| EP | 742682 | 11/1996 |
| JP | 11160355 | 6/1999 |

(Continued)

OTHER PUBLICATIONS

International Search Report of International Application No. PCT/JP02/06647 dated Oct. 15, 2002.

(Continued)

*Primary Examiner*—Ernest Karlsen
(74) *Attorney, Agent, or Firm*—Pearl Cohen Zedek Latzer, LLP (57) ABSTRACT

In the electroconductive contact unit of the present invention, an electroconductive needle member 2 is made of a noble metal alloy having a high hardness and wear resistance, and formed with a gold plated layer 8 via a Ni under layer 7, and a flat surface 2e is formed by a tip portion thereof so as to expose the material of the needle member. Thereby, the durability of the needle member is ensured and the electroconductivity of the electric path between the needle member and coil spring is minimized on account of the gold plated layer. Even when the contact surface is soiled by solder deposition after repeated applications to contact objects such as solder balls, simply grinding the contact surface and revealing a new surface, the contact resistance between the contact surface and contact object can be kept unchanged by grinding so that the test can be conducted with the benefit of low resistance at all times.

8 Claims, 5 Drawing Sheets

FOREIGN PATENT DOCUMENTS

| | | |
|---|---|---|
| JP | 2000137042 | 5/2000 |
| WO | WO 98/29751 | 7/1998 |
| WO | WO 03/005042 | 1/2003 |

OTHER PUBLICATIONS

International Preliminary Examination Report of International Application No. PCT/JP02/06648, dated Jul. 1, 2002.

* cited by examiner

ELECTROCONDUCTIVE CONTACT UNIT

CROSS REFERENCE TO RELATED APPLICATIONS

This present application is a 35 USC 371 national stage application of PCT/JP02/06648, filed Jul. 1, 2002, which in turn claims priority from prior Japanese application 2001-201176, filed Jul. 2, 2001.

TECHNICAL FIELD

The present invention relates to an electroconductive contact unit for exchanging signals with printed circuit boards, electronic devices or the likes.

BACKGROUND OF THE INVENTION

A conventional electroconductive contact unit for use in contact probes for electrically testing conductor patterns of printed circuit boards and electronic devices typically comprises an electroconductive needle member and a tubular holder that receives the needle member in an axially moveable manner, and the needle member is resiliently urged by a coil spring in the direction to project the tip of the needle member from the front end of the holder so that the tip of the needle member may be resiliently brought into contact with an object to be tested.

Silicon wafers and ceramic packages for use with semiconductor devices and glass panels for use in LCD panels are made of materials having a relatively high hardness. These components are provided with electric circuitry, and are subjected to electric testing during the manufacturing process. An electroconductive contact unit (contact probe) is used for such a purpose, and is adapted to establish electric contact with a part of the circuitry such as a terminal.

One form of such tests is the wafer level test (WLT), and noble metal alloys are sometimes used for the needle member of an electroconductive contact unit for use in such a test. Paliney 7 (tradename of The J. M. Ney Company of Bloomfield, Conn.) is one of such noble metal alloys, and is highly electroconductive, hard and wear resistant for a noble metal alloy, and resistant to surface oxidization so that the contact resistance would not increase for an extended period of time. An electroconductive contact unit using an electroconductive needle member made of this material is suitable for testing a device via a solder ball.

When a needle member is applied repeatedly to solder balls, solder inevitably deposits on the contact surface of the needle member over time. Such a soiled contact surface can be renewed to an original state by grinding the surface when the needle member is made of a noble metal alloy. On the other hand, when the needle member is made of SK material (carbon tool steel) and is provided with a plated surface, grinding of the contact surface only exposes the material of the needle member, and the original electric property cannot be regained.

A needle member made of a noble metal alloy such as Paliney 7 demonstrates a high electroconductivity, but is not so favorable as that of a needle member made of gold or plated with gold. As the performance of the semiconductor products becomes higher, the electric properties of the existing needle member made of a noble metal alloy are found to be more and more unsatisfactory. By increasing the thickness of the gold plated layer, the needle member can be ground and renewed for an increased number of times before the material of the needle member is exposed. However, increasing the thickness of the gold plated layer increases the manufacturing cost of the needle member, and the needle member cannot be ground not so many times as desired.

SUMMARY OF THE INVENTION

In view of such problems of the prior art and to improve the electric property of an electroconductive contact unit that can be renewed by grinding, the present invention provides an electroconductive contact unit including an electroconductive needle member having a contact surface for engaging an object to be contacted at a tip portion thereof, and a coil spring resiliently urging the needle member in a direction to bring the contact surface into contact with an object to be contacted, characterized by that: the needle member is made of a noble metal alloy having a high hardness and wear resistance and is plated with a material having a high electroconductivity over an outer circumferential surface thereof, the contact surface being defined by exposing the noble metal alloy by grinding.

Thus, because the needle member is made of the noble metal alloy having a high hardness and wear resistance, it is highly durable in the sense that it can withstand numerous contacts. Owing to the fact that the outer circumferential surface of the needle member is plated with gold, the electroconductivity of the electric path between the needle member and coil spring can be maximized. In particular, because the contact surface is defined by exposing the noble metal alloy by grinding, even when the contact surface is soiled by solder after repeated contacts with such contact objects as solder balls, the contact surface can be renewed simply by grinding the contact surface, and the renewed surface consists of the exposed surface of the noble metal alloy which is not different from the original contact surface. Therefore, the contact resistance between the contact surface and object of contact would remain unchanged even by the repeated renewing of the contact surface.

If the noble metal alloy contains palladium and at least two members selected from a group consisting of silver, platinum, gold, copper and zinc, the needle member can be made highly hard and wear resistant. In particular, if the noble metal alloy contains at least palladium, silver and copper, the needle member can be made not only highly hard and wear resistant but also favorably electroconductive. If the plating material having a high electroconductivity consists of gold, a high resistance to corrosion and favorable electric properties can be ensured in a stable manner.

If the electroconductive contact unit further comprises a second electroconductive needle member at the other end of the coil spring, and the coil spring comprises a closely wound portion interposed between the first needle member and second needle member, even when one of the electroconductive needle members is made of a noble metal alloy having a high hardness and wear resistance but too poor in workability to allow the diameter of the needle member to be reduced to a desired level, owing to the presence of the closely wound portion in the coil spring between the two needle members, as can be readily appreciated, the electric signal can flow axially through the closely wound portion of the compression coil spring, instead of along a spiral path, so that the inductance of the electroconductive contact unit can be effectively minimized. Therefore, even when the length of one of the needle members cannot be adequately increased, and the distance between the two needle members is thereby made relatively large, the inductance of the electric path between the two needle members can still be minimized.

Also in the case of the electroconductive contact unit having two moveable ends, it is preferred that the noble metal alloy contains palladium and at least two members selected from a group consisting of silver, platinum, gold, copper and zinc, and in particular that the noble metal alloy contains at least palladium, silver and copper. It is also preferred that the plating material having a high electroconductivity consists of gold.

BRIEF DESCRIPTION OF THE DRAWINGS

Now the present invention is described in the following with reference to the appended drawings, in which.

DETAILED DESCRIPTION OF THE PREFERRED EMBODIMENTS

Preferred embodiments of the present invention are described in the following with reference to the appended drawings.

Figure 1:
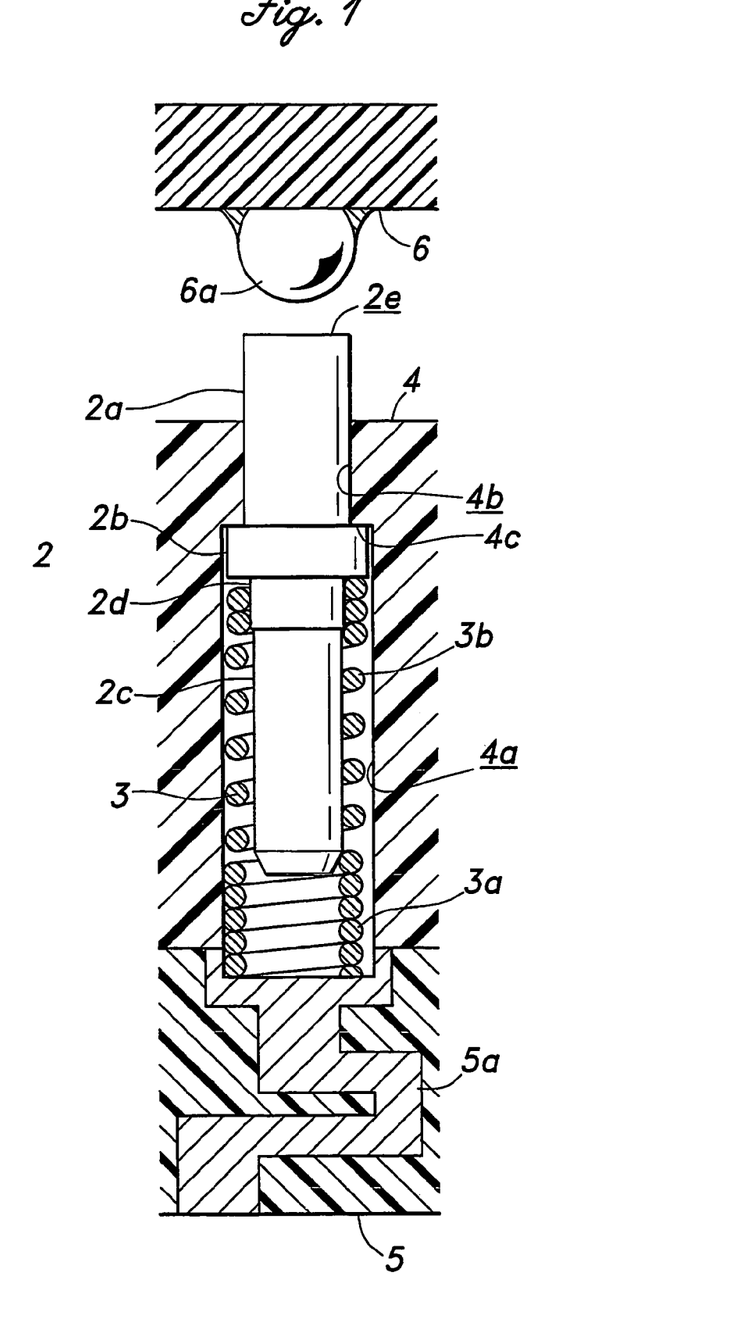
FIG. 1 is a vertical sectional view of an electroconductive contact unit for use in a contact probe embodying the present invention.

FIG. 1 is a vertical sectional view showing an electroconductive contact unit 1 for use in a contact probe embodying the present invention. This electroconductive contact unit 1 may be used by itself, but is particularly suitable for use in a holder (probe head) of a multipoint contact probe as one of a large number of similar electroconductive contact units that are arranged one next to another, for instance for a wafer level test. In such a contact probe, the holder is integrally attached to a board mounted on a testing machine via a relay circuit board. The drawing is for illustration purpose only, and the actual aspect ratio may differ from that of the illustrated example.

The electroconductive contact unit 1 comprises an electroconductive needle member 2, a compression coil spring 3 and a holder 4 made of electrically insulating material and defining a large diameter holder hole 4a and a small diameter holder hole 4b in a coaxial relationship for receiving the electroconductive needle member 2 and compression coil spring 3 therein. The electroconductive needle member 2 comprises a needle portion 2a having a flat-ended tip portion, a flange portion 2b having a more enlarged diameter than the needle portion 2a, and a stem portion 2c projecting from the other end (the lower end in the drawing) of the flange portion 2b and having a more reduced diameter than the flange portion 2b. These portions 2a, 2b and 2c are each provided with a circular cross section, and disposed in a mutually coaxial relationship.

The part of the stem portion 2c of the electroconductive needle member 2 adjacent to the flange portion 2b is formed as an enlarged diameter portion 2d having a slightly larger diameter than the rest of the stem portion 2c. The enlarged diameter portion 2d is press fitted into an end of the compression coil spring 3, and the corresponding coil end thereby resiliently wraps around the enlarged diameter portion 2d. The electroconductive needle member 2 is connected to the compression coil spring 3 in this manner. The connection between the enlarged diameter portion 2d and the corresponding end of the compression coil spring 3 can be accomplished not only by the resilient wrapping described above but also by other means such as soldering. In regard to how the compression coil spring 3 is wound, the one end portion connected to the enlarged diameter portion 2d consists of a closely wound portion, and the intermediate portion consists of a coarsely wound portion while the other coil end portion is provided with a closely wound portion 3a having a prescribed length.

The small diameter holder, hole 4b of the holder 4 axially slidably receives the cylindrical portion of the needle portion 2a, and the large diameter holder hole 4a receives the flange portion 2b, enlarged diameter portion 2d, stem portion 2c and compression coil spring 3. The lower surface of the holder 4 in the drawing is attached to a relay circuit board 5 which closes the open end of the large diameter holder hole 4a. The relay circuit board 5 is fixedly attached to the holder 4 by threaded bolts not shown in the drawing, and is provided with an internal circuitry 5a having a terminal surface opposing the large diameter holder hole 4a.

As shown in the drawing, when the holder 4 and relay circuit board 5 are assembled to each other, the electroconductive needle member 2 is prevented from coming off from the holder hole by the flange portion 2b being engaged by a shoulder 4c defined between the small diameter holder hole 4b and large diameter holder hole 4a. The axial length of the large diameter holder hole 4a is determined in such a manner that the compression coil spring 3 is subjected to a prescribed initial load by a compressive deformation thereof. The axial lengths of the stem portion 2c and closely wound portion 3a are determined in such a manner that the lower end of the stem portion 2c in the drawing engages the closely wound portion 3a in the illustrated initial state.

Figure 2:
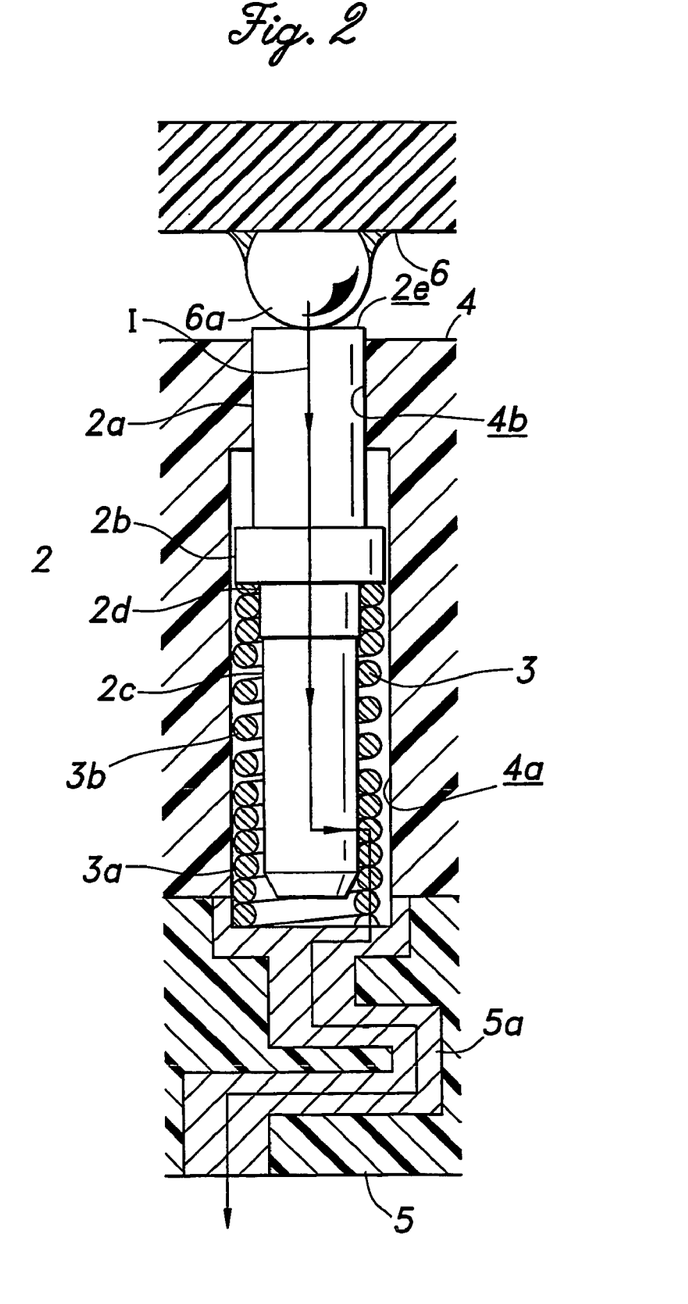
FIG. 2 is a view similar to FIG. 1 showing the contact unit brought into contact with an object.

Referring to FIG. 2, by engaging the flattened tip of the electroconductive needle member 2a onto an object to be tested such as a solder ball 6a of a wafer 6, an electric signal I is transmitted from the side of the wafer 6 to the relay circuit board 5 via the electroconductive needle member 2 and compression coil spring 3. The signal is then forwarded to a control system not shown in the drawing via a circuit board not shown in the drawing connected to the relay circuit board 5, and a desired test can be conducted.

In the initial state, the stem portion 2c is in contact with the closely wound portion 3a, and a reliable contact between the stem portion 2c and closely wound portion 3a can be ensured at the time of testing as shown in FIG. 2. The electric signal I is conducted axially through the electroconductive needle member 2, and then to the closely wound portion 3a. As can be readily appreciated, the electric signal can flow axially through the closely wound portion 3a of the compression coil spring 3, instead of along a spiral path, so that the inductance of the electroconductive contact unit 1 can be effectively minimized.

Figure 3:
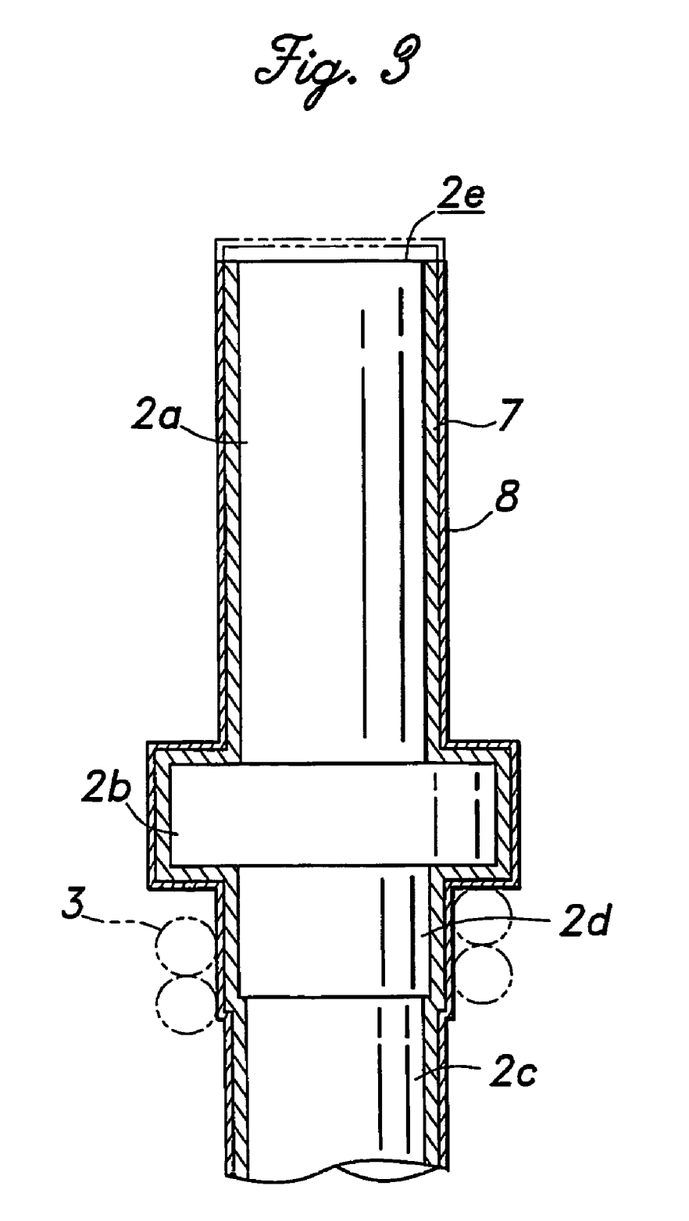
FIG. 3 is a fragmentary enlarged sectional view of the needle member.

The electroconductive needle member 2 of the electroconductive contact unit 1 according to the present invention is made of highly conductive, hard and wear resistant noble metal alloy such as Paliney 7 mentioned earlier in connection with the prior art, and a gold plated layer 8 is formed on the surface thereof via a Ni under layer 7 as illustrated in FIG. 3. After the gold plated layer 8 is formed over the entire outer surface of the electroconductive needle member 2 via the Ni under layer 7, the tip (upper end in the drawing) is ground into a flat surface 2e by removing the part indicated by the imaginary line and the material of the electroconductive needle member 2 which is Paliney 7 is exposed.

The material of the electroconductive needle member 2 is not limited to Paliney 7, but may also consist of an alloy containing palladium (Pd) and two members selected from a group consisting of silver (Ag), platinum (Pt), gold (Au), copper (Cu) and zinc (Zn). The alloy preferably includes at least palladium, silver and copper, and more preferably contains 35% palladium, 30% silver, 10% platinum, 10% gold, 14% copper and 1% zinc. It may include other elements as long as it is a noble metal alloy having a high hardness and wear resistance.

When the electroconductive needle member 2 prepared in this manner is applied to a solder ball 6a numerous times, foreign matter such as solder inevitably deposits on the flat surface 2e so that the flat surface 2e is required to be cleaned regularly. Such a cleaning can be accomplished by grinding the flat surface 2e, and exposing a new flat surface. Because the newly exposed flat surface is not different from the original flat surface (where the noble metal alloy is exposed) in terms of electric property. By repeating such a cleaning process, the original electric property or stable electric property can be maintained indefinitely.

Because the flat surface 2e is formed after forming the gold plated layer 8 on the electroconductive needle member 2 as mentioned earlier, the outer circumferential surface of the electroconductive needle member 2 is coated with the gold plated layer 8. Therefore, the enlarged diameter portion 2d which is press fitted into the compression coil spring 3 and the stem portion 2c that engages the closely wound portion 3a are plated with gold. Therefore, as shown in FIG. 2, the electric resistance between the stem portion 2c and closely wound portion 3a can be made highly stable. The gold plated layer 8 also improves corrosion resistance, and ensures a low electric resistance. Even when a part of the electric current flows through the press fitted part of the compression coil spring 3, the contact resistance in this part is prevented from adversely affecting the performance of the electroconductive needle member.

To stabilize the contact resistance and prevent oxidization, the compression coil 3 may be plated with gold. The flat surface 2e was formed at the tip of the needle portion 2a for engagement with a solder ball 6 in the illustrated embodiment, but it is not required to be exactly flat but may also consist of a concave or convex surface having a relatively large radius of curvature. In such cases also, the contact surface can be cleaned or renewed by grinding the surface with a suitably shaped cutter.

Durability tests were conducted on the electroconductive contact unit 1 described above. The maximum electric resistance of the embodiment having an electroconductive needle member made of Paliney 7, plated with gold and ground so as to form the flat surface 2e at its tip was approximately 210 to 460 mΩ up to 200,000 times of contact whereas the maximum resistance of an electroconductive contact unit having an electroconductive needle member simply made of Paliney 7 was approximately 420 to 730 mΩ up to 200,000 times of contact. This demonstrates that the electroconductive contact unit of the present invention matches in performance the increased performance of the semiconductor products.

The foregoing embodiment was directed to a contact unit having only one moveable end, but the present invention is equally applicable to contact units having two moveable ends on either axial end of the compression coil spring. Such an example is described in the following with reference to FIG. 4.

Figure 4:
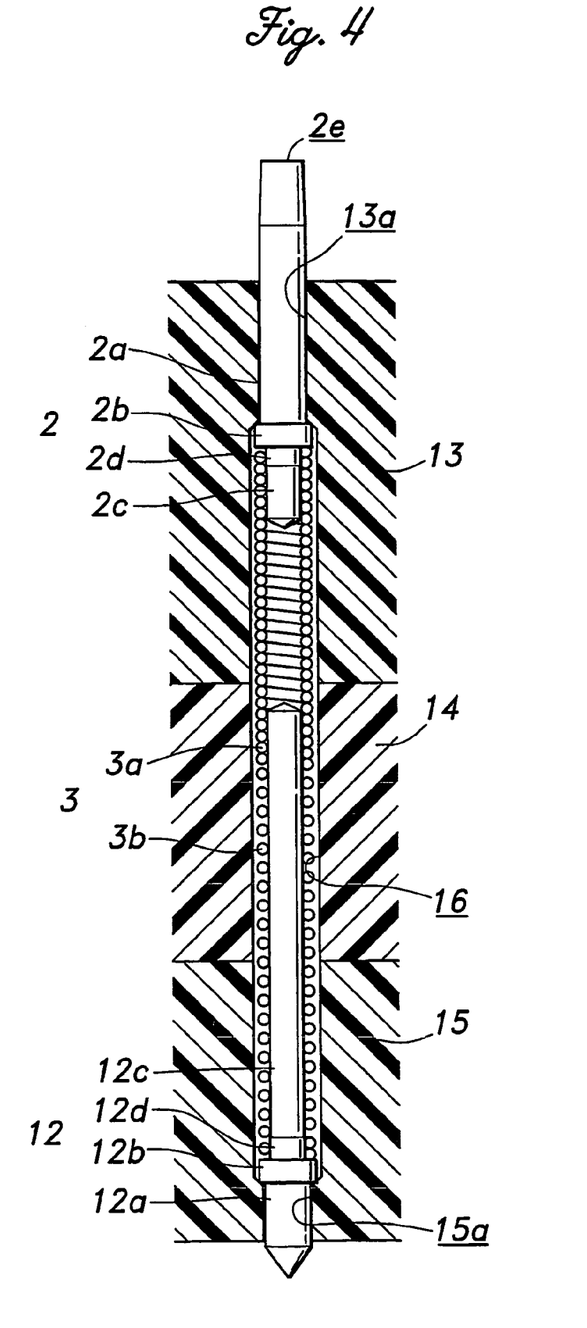
FIG. 4 is a view similar to FIG. 1 showing a second embodiment of the present invention.

The upper part of the illustrated embodiment may be similar to that of the previous embodiment, and like parts are denoted with like numerals without repeating the description of such parts. One of the electroconductive needle members 2 of the illustrated embodiment (the upper needle member in the drawing) is tapered at its tip portion in such a manner that the longitudinal section of the tip portion with provided with a trapezoidal shape. The electroconductive needle member 2 is joined with the compression coil spring 3 by resiliently press fitting the enlarged diameter portion 2d into a closely wound portion 3a provided at an end (upper end in the drawing) of the compression coil spring 3, and another electroconductive needle member 12 is coaxially provided at the other end (lower end in the drawing) of the compression coil spring 3.

Figure 5:
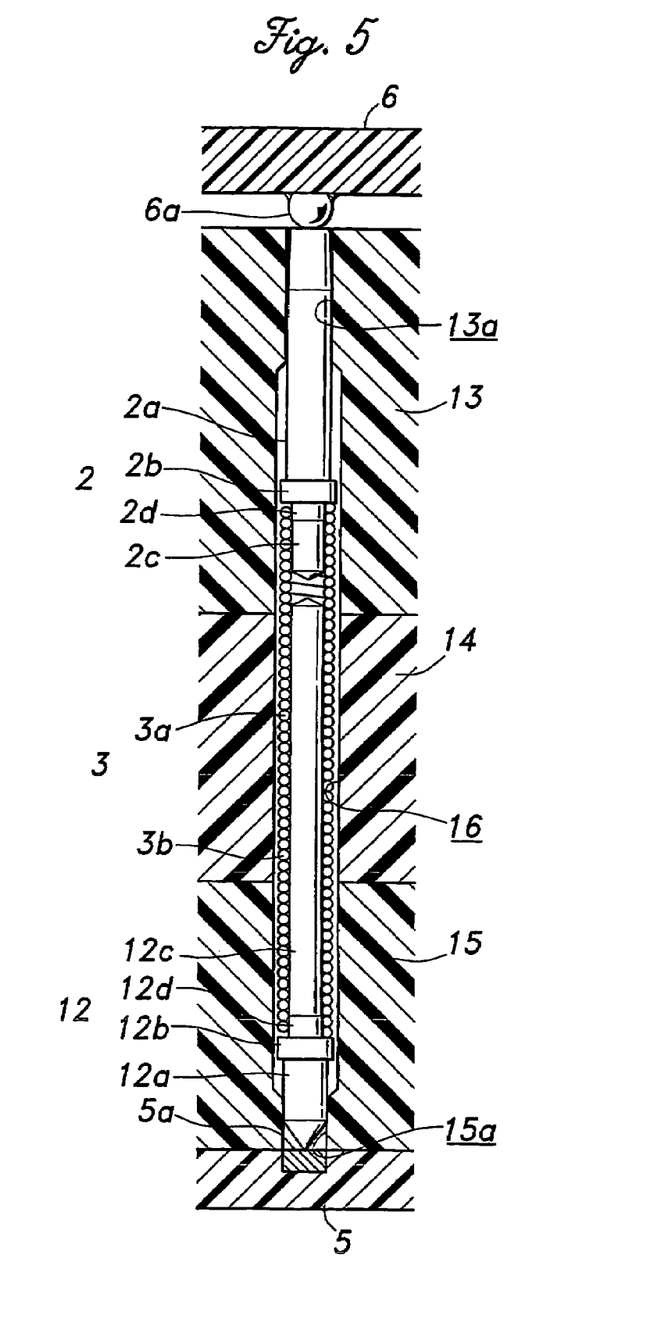
FIG. 5 is a view showing the second embodiment when applied to an object.

In this contact unit having two moveable ends, an electric signal is transmitted to the circuitry 5a in the relay circuit board 5 via the electroconductive needle member 12 as illustrated in FIG. 5. The tip of the needle portion 2a of the one electroconductive needle member 2 is provided with a flat surface 2e because it is intended to contact a solder ball 6a similarly as the previous embodiment, and a plane contact is intended, instead of a point contact. On the other band, the needle portion 12a of the other electroconductive needle member 12 is provided with a pointed tip as shown in the drawing because it is intended to contact a planar pad of the circuitry 5a incorporated in the relay circuit board 5.

The material of the lower needle member 12 may consist of a highly workable SK material instead of a noble metal alloy, and its surface may be gold plated so that a high electroconductivity may be ensured because the needle portion 12a is always kept in contact with the pad surface of the circuitry 5a and therefore does not require to be ground for cleaning purpose. The electroconductive needle member 12 comprises a flange portion 12b for preventing the electroconductive needle member 12 from coming off, a stem portion 12 and an enlarged diameter portion 12d. The enlarged diameter portion 12d is press fitted into a coil end of the compression coil spring 3 consisting of a coarsely wound portion 3b and located adjacent to the needle member 12.

Because the workability of Paliney 7 is not particularly favorable, there may be some manufacturing problems in achieving a desired axial length of the stem portion 2c when the diameter of the stem portion 2c is extremely small. In such a case, the electric signal may have to travel a relatively long distance along the compression coil spring 3. In particular, when the electric signal flows along the coil wire of the compression coil spring along a spiral path between the two electroconductive needle members, the electric current will encounter a significant inductance. Therefore, in the illustrated embodiment, the part of the coil spring 3 adjacent to the electroconductive needle member 2 is formed as a closely wound portion 3a, and the axial length of the closely wound portion 3a is selected in such a manner that the end of the closely wound portion 3a adjacent to the electroconductive needle member 12 is in contact with the stem portion 12c of the needle member 12 in the initial sate (prior to the test) illustrated in FIG. 4. Alternatively, it may be so arranged that this contact is established only as a result of a certain displacement of the electroconductive needle member 12 at the time of a test. At any even, when the total axial length of the contact unit having two moveable ends is significant, the stem portion 12c of the other electroconductive needle member 12 made of more workable material may be elongated so that the stem portion 12c and closely wound portion 3a may come into mutual contact at the time of a test.

Thereby, the electric signal can reach the lower needle member 12 via the closely wound portion 3a. As can be readily appreciated, the electric signal can flow axially through the closely wound portion 3a of the compression coil spring 3 so that the test can be conducted with the benefit of both low and stable electric resistance.

The holder for the electroconductive contact unit shown in FIG. 4 consists of three layers of insulating plate members. A large diameter holder hole 16 is passed in the upper plate member 13, intermediate plate member 14 and lower plate member 15. The upper plate member 13 is additionally formed with a small holder hole 13a which is dimensioned so as to slidably receive the needle portion 2a of the electroconductive needle member 2 and prevent the flange portion 2b from coming off. Similarly, the lower plate member 15 is formed with a small diameter holder hole 15a which is dimensioned so as to slidably receive the needle portion 12a of the electroconductive needle member 12 and prevent the flange portion 12b from coming off.

When the plate members 13, 14 and 15 are laminated and held integrally together by threaded bolts not shown in the drawing, the compression coil spring 3 is compressed to a certain extent so as to produce a certain initial load. As shown in FIG. 5, a relay circuit board 5 is laminated upon the lower plate member 15 and is integrally joined thereto by threaded bolts not shown in the drawing so that the electroconductive needle member 12 is resiliently urged against the circuitry 5a in the relay circuit board 5.

When the electroconductive contact unit having two moveable ends is applied to a solder ball 6a for testing, the upper needle member 2 is pushed into the large diameter holder hole 16 against the resilient force of the compression coil spring 3 and the upper needle member 2 engages the solder ball 6a under the compressive load of the compression coil spring 3. The upper needle member 2 is completely received into the upper plate member 13 in the state illustrated in FIG. 5, but it does not mean that this state is always produced at the time of testing.

The electric signal at this time is conducted from the upper needle member 2 to the stem portion 12c of the lower needle member 12 via the closely wound portion 3a, and then reaches the relay circuit board 5 via the lower needle member 12. By selecting the relative lengths of the closely wound portion 3a and stem portion 12c of the lower needle member 12, the electric signal can be transmitted to the lower needle member 12 via the closely wound portion 3a without regard to the contact position of the solder ball 6a (or the projecting length of the upper needle member 2). As can be readily appreciated, the electric signal can flow axially through the compression coil spring 3 so that the test can be conducted with the benefit of both low and stable electric resistance.

Although the present invention has been described in terms of preferred embodiments thereof,-it is obvious to a person skilled in the art that various alterations and modifications are possible without departing from the scope of the present invention which is set forth in the appended claims.

INDUSTRIAL APPLICABILITY

As can be appreciated from the foregoing embodiments, because the needle member is made of the noble metal alloy having a high hardness and wear resistance, it is highly durable in the sense that it can withstand numerous contacts. Owing to the fact that the outer circumferential surface of the needle member is plated with gold, the electroconductivity of the electric path between the needle member and coil spring can be maximized. In particular, because the contact surface is defined by exposing the noble metal alloy by grinding, even when the contact surface is soiled by solder after repeated contacts with such contact objects as solder balls, the contact surface can be renewed simply by grinding the contact surface, and the renewed surface consists of the exposed surface of the noble metal alloy which is not different from the original contact surface. Therefore, the contact resistance between the contact surface and object of contact would remain unchanged even by the repeated renewing of the contact surface.

In the case of an electroconductive contact unit having two moveable ends, by providing a closely wound portion in the compression coil spring between the two electroconductive needle members, the electroconductive path between the two needle members may be made to consist of the closely wound portion of the coil spring. Thereby, as can be readily appreciated, the electric signal can flow axially through the closely wound portion of the compression coil spring, instead of along a spiral path, so that the inductance of the electroconductive contact unit can be effectively minimized. Therefore, even when one of the electroconductive needle members is made of a noble metal alloy which may be too poor in workability to allow the diameter of the needle member to be reduced to a desired level, and the distance between the two needle member is thereby made relatively large, the inductance of the electric path between the two needle members can still be minimized. Therefore, even when one of the needle members is made of the noble metal alloy having a high hardness and wear resistance, the electroconductive contact unit having two moveable ends can be given with a desired electric property.

In particular when the noble metal alloy contains palladium and at least two members selected from a group consisting of silver, platinum, gold, copper and zinc, the needle member can be made highly hard and wear resistant for a noble metal alloy. Also, because the surface is free from oxidization, the electric resistance can be kept low for an extended period of time, and the contact surface is not required to be plated with material having a high electroconductivity. Therefore, this material is particularly suitable for use in needle members that are regularly ground for cleaning. If the noble metal alloy contains at least palladium, silver and copper, the needle member can be provided additionally with a favorable electroconductivity. If the plating material having a high electroconductivity consists of gold, a high resistance to corrosion and favorable electric properties can be ensured in a stable manner.

The invention claimed is:

1. An electroconductive contact unit comprising an electroconductive needle member having a contact surface for engaging an object to be contacted at a tip portion thereof, and a coil spring disposed around the circumference of the needle member resiliently urging the needle member in a direction to bring the contact surface into contact with the object, the coil spring providing an electric path for the needle member through the circumference thereof, wherein the needle member is made of a noble metal alloy having a high hardness and wear resistance and is plated with a material having a high electroconductivity over an outer circumferential surface thereof, the contact surface being defined by exposing the noble metal alloy through grinding.

2. An electroconductive contact unit according to claim 1, wherein the noble metal alloy comprises palladium and at least two members selected from a group consisting of silver, platinum, gold, copper and zinc.

3. An electroconductive contact unit according to claim 1, wherein the noble metal alloy comprises at least palladium, silver and copper.

4. An electroconductive contact unit according to claim 1, wherein the plating material having a high electroconductivity comprises gold.

5. An electroconductive contact unit according to claim 1, wherein the electroconductive needle member is a first electroconductive needle member, further comprising a second electroconductive needle member, the coil spring comprising a closely wound portion interposed between the first needle member and the second needle member.

6. An electroconductive contact unit according to claim 5, wherein the noble metal alloy comprises palladium and at least two members selected from a group consisting of silver, platinum, gold, copper and zinc.

7. An electroconductive contact unit according to claim 5, wherein the noble metal alloy comprises at least palladium, silver and copper.

8. An electroconductive contact unit according to claim 5, wherein the plating material having a high electroconductivity comprises gold.

* * * * *